(12) United States Patent
Iyengar

(10) Patent No.: US 8,787,059 B1
(45) Date of Patent: Jul. 22, 2014

(54) CASCADED CONTENT ADDRESSABLE MEMORY ARRAY HAVING MULTIPLE ROW SEGMENT ACTIVATION

(75) Inventor: Vinay Iyengar, Cupertino, CA (US)

(73) Assignee: NetLogic Microsystems, Inc., Irvine, CA (US)

( * ) Notice: Subject to any disclaimer, the term of this patent is extended or adjusted under 35 U.S.C. 154(b) by 354 days.

(21) Appl. No.: 13/311,301

(22) Filed: Dec. 5, 2011

(51) Int. Cl.
| | | |
|---|---|---|
| G11C 15/00 | (2006.01) | |
| G11C 15/04 | (2006.01) | |
| G11C 7/10 | (2006.01) | |
| G06F 17/30 | (2006.01) | |

(52) U.S. Cl.
 CPC ............ *G11C 15/04* (2013.01); *G11C 15/00* (2013.01); *G11C 7/1048* (2013.01); *G06F 17/30982* (2013.01)
 USPC ............. 365/49.17; 365/49.15; 365/49.16; 365/203; 365/227; 365/195; 711/108

(58) Field of Classification Search
 CPC .......... G11C 8/08; G11C 7/12; G11C 7/1048; G11C 15/04; G11C 15/00; G11C 11/4091; G11C 11/4085; G06F 17/30985; G06F 17/30982
 USPC .......... 365/203, 204, 227, 49.1, 49.15, 49.16, 365/49.17, 195; 711/108
 See application file for complete search history.

(56) References Cited

U.S. PATENT DOCUMENTS

| | | | |
|---|---|---|---|
| 5,220,526 A | * | 6/1993 | Giles et al. .................. 365/49.1 |
| 5,652,580 A | * | 7/1997 | Saxena ............................ 341/50 |
| 6,191,969 B1 | | 2/2001 | Pereira |
| 6,191,970 B1 | | 2/2001 | Pereira |
| 6,243,280 B1 | | 6/2001 | Wong et al. |
| 6,430,074 B1 | | 8/2002 | Srinivasan |
| 6,958,925 B1 | | 10/2005 | Om et al. |
| 7,050,318 B1 | | 5/2006 | Argyres |
| 7,237,156 B1 | | 6/2007 | Srinivasan et al. |
| 7,643,353 B1 | | 1/2010 | Srinivasan et al. |
| 7,920,398 B1 | | 4/2011 | Khanna et al. |

OTHER PUBLICATIONS

Haesung Hwang et al., "A New TCAM Architecture for Managing ACL in Routers", IEICE Trans. Commun., Vol. E93-B, No. 11, 9 pages, Nov. 2010.
Pankaj Gupta et al., "Algorithms for Packet Classification", Computer Systems Laboratory, Stanford University, 29 pages, 2001.

(Continued)

*Primary Examiner* — J. H. Hur
(74) *Attorney, Agent, or Firm* — Sterne, Kessler, Goldstein & Fox PLLC

(57) ABSTRACT

A content addressable memory (CAM) device has an array including a plurality of CAM rows that are partitioned into row segments, wherein a respective row includes a first row segment including a number of first CAM cells coupled to a first match line segment, a second row segment including a number of second CAM cells coupled to a second match line segment, and a circuit to selectively pre-charge the first match line segment in response to a value indicating whether data stored in the first row segment of the respective row is the same as data stored in the first row segment of another row. Power consumption can be reduced during compare operations in which the first row segment of another row that stores the same data as the first row segment of the respective row is not enabled.

31 Claims, 10 Drawing Sheets

(56) References Cited

OTHER PUBLICATIONS

David E. Taylor et al., "ClassBench, A Packet Classification Benchmark", IEEE INFOCOM, 12 pages, 2005.

Ori Rottenstreich et al., "Worst-Case Tcam Rule Expansion", Technion—Israel Institute of Technology, Haifa 32000, Israel, 19 pages, Mar. 2010.

* cited by examiner

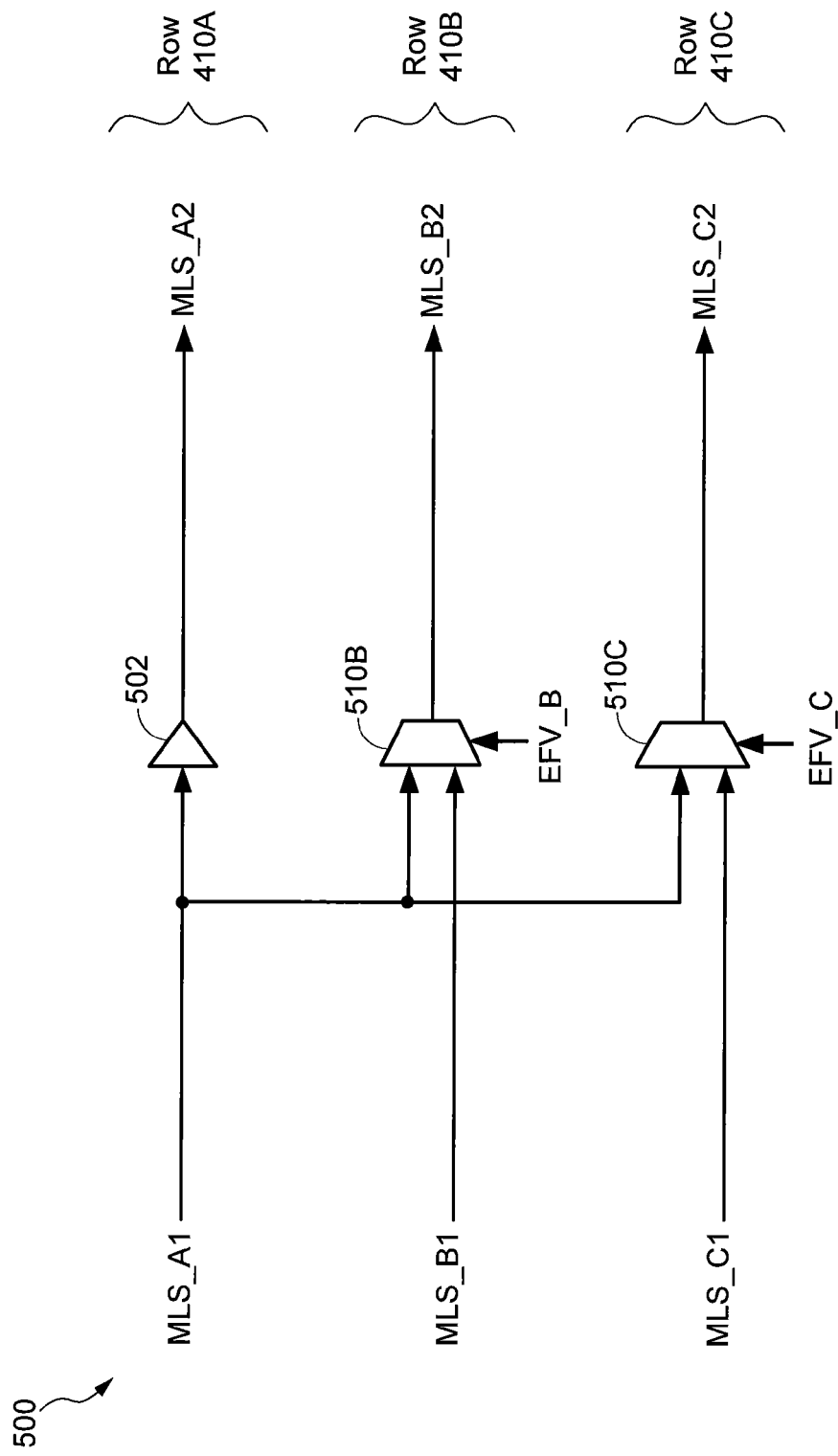

CASCADED CONTENT ADDRESSABLE
MEMORY ARRAY HAVING MULTIPLE ROW
SEGMENT ACTIVATION

TECHNICAL FIELD

The present disclosure relates generally to content addressable memory (CAM) devices and specifically to power saving techniques in CAM devices.

BACKGROUND

Content addressable memory (CAM) devices are frequently used in network switching and routing applications to determine forwarding destinations, to perform classification functions, to implement Quality of Service (QoS) functions, and to perform other tasks associated with routing data packets across a network. More specifically, a CAM device includes a CAM array having a plurality of CAM cells organized in a number of rows and columns. Each row of CAM cells, which can be used to store a CAM word, is coupled to a corresponding match line that indicates match results for the row. During a compare operation, a search key is provided to the CAM array and compared with the CAM words stored therein. For each CAM word that matches the search key, a corresponding match line is asserted to indicate the match condition, and a priority encoder determines the match address or index of the highest priority matching (HPM) entry in the CAM array.

More specifically, the match lines of the CAM array are typically pre-charged to a logic high state (e.g., towards VDD) prior to the compare operation. During the compare operation, if all CAM cells in a row match the comparand data, the CAM cells do not discharge the row's match line, which remains in its charged state to indicate a match condition for the row. Conversely, if any CAM cell in the row does not match the comparand data, the CAM cell discharges the match line to a logic low state (e.g., towards ground potential) to indicate a mismatch condition for the row. The discharged match lines are pre-charged for the next compare operation.

Thus, for each row having a mismatch condition, an associated match line is first charged high towards VDD and then discharged low towards low ground potential. Current flow associated with charging and discharging match lines during successive compare operations results in undesirable power consumption. Accordingly, there is a need to minimize the power consumption associated with performing compare operations in CAM arrays.

BRIEF DESCRIPTION OF THE DRAWINGS

Present embodiments are illustrated by way of example, and not by way of limitation, in the figures of the accompanying drawings and in which like reference numerals refer to similar elements and in which:

FIG. 5A is a more detailed block diagram of one embodiment of the interconnect circuit of FIG. 4A;

DETAILED DESCRIPTION

Figure 1:
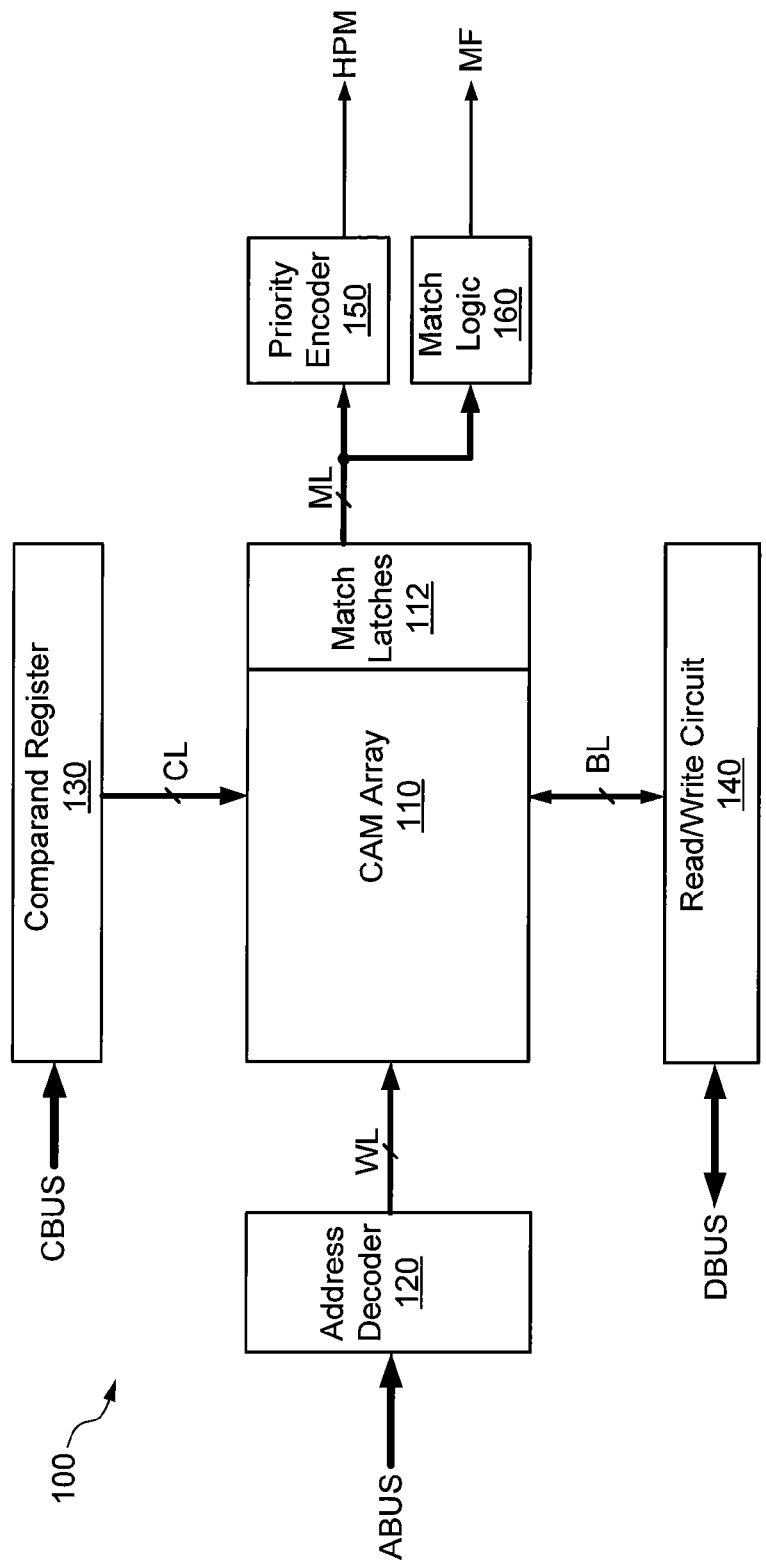
FIG. 1 is a block diagram of a CAM device within which the present embodiments can be implemented.

Methods and apparatuses for reducing power consumption in a CAM device are discussed below. In the following description, for purposes of explanation, specific nomenclature is set forth to provide a thorough understanding of the present embodiments. However, it will be apparent to one skilled in the art that these specific details may not be required to practice the present embodiments. It is to be understood that the present embodiments are equally applicable to CAM structures of other sizes and configurations, as well as to other types of memory devices such as, for instance, RAM, Flash, and EEPROM. In other instances, well-known circuits and devices are shown in block diagram form to avoid obscuring the present embodiments unnecessarily. Additionally, the interconnection between circuit elements or blocks may be shown as buses or as single signal lines. Each of the buses may alternatively be a single signal line, and each of the single signal lines may alternatively be a bus. Further, the logic levels assigned to various signals in the description below are arbitrary, and therefore may be modified (e.g., reversed polarity) as desired. Accordingly, the present embodiments are not to be construed as limited to specific examples described herein but rather include within their scope all embodiments defined by the appended claims.

Present embodiments minimize power consumption of a CAM device by partitioning the rows of the CAM array into a plurality of cascaded row segments, setting an equi-field value indicating whether the first row segments of a selected group of rows store the same data, selectively enabling the first row segment of only one of the rows of the selected group in response to the equi-field value, and then selectively enabling subsequent row segments of the selected group of rows for compare operations in response to a combination of match conditions in the first row segments and the equi-field value. For example, if the first row segments of the selected group of rows store the same data, then the equi-field value (EFV) associated with the selected group of rows is driven to a first state to indicate that the corresponding first row segments store the same data (e.g., and thus have equivalent data fields). Then, the first row segment of a designated one of the rows of the selected group is enabled for a first stage of a pipelined compare operation (e.g., in which a first portion of the search key is compared with data stored in the first row segments), and the first row segments of the other rows of the selected group are disabled to reduce power consumption, such that the first row segments of the other rows of the selected group do not participate in the first stage of the compare operation. Next, match results of the first row segment of the designated row, which would be the same as the match results of the first row segments of the other rows of the selected group (e.g., because they all store the same data), are used to selectively enable the second row segments of the rows of the selected group. Thus, if there is a match condition in the first row segment of the designated row, then the second row segments of all the rows in the selected group are enabled for a second stage of the pipelined compare operation (e.g., in which a second portion of the search key is compared with data stored in the second row segments). Conversely, if there is a mismatch condition in the first row segment of the designated row, then the second row segments of all the rows in the selected group are disabled, and the array indicates a mismatch condition for the search key. This selectively enabled, pipelined compare operation can continue in a similar manner across all segments of the cascaded CAM array.

Thus, in accordance with the present embodiments, if all the first row segments of the selected group of rows store the same data, power consumption is reduced by enabling only a designated one of the first row segments of the selected group. More specifically, disabling the first row segments of the other non-designated rows of the selected group reduces power consumption by not pre-charging the first match line segments of the other rows. In this manner, match results from the first row segment of the designated row can be used to selectively enable not only the second row segment of the designated row but also the second row segments of a plurality of other rows in the selected group (e.g., of all other rows in the selected group), thereby avoiding generating unnecessary duplicative match results in the first segment of the CAM array.

For some embodiments, an equi-field processor can be used to analyze the contents of the first CAM array segment to determine which rows store the same data, and to then identify groups of rows that store the same data in their first row segments. For one embodiment, the equi-field processor can be configured to re-order entries in the CAM array so that groups of entries that share a common first portion are stored in corresponding groups of adjacent rows.

Further, for some embodiments, the array includes a number of interconnect circuits, each positioned between adjacent CAM array segments and configured to selectively enable subsequent row segments of one or more groups of selected rows in response to match conditions in the previous row segment of a designated row in the one or more groups of selected rows. For example, if an equi-field value indicates that the first row segments of a group of rows store the same data, then the corresponding interconnect circuit can selectively enable the second row segments of the group of rows in response to match conditions in the first row segment of a designated row of the group. Conversely, if the equi-field value indicates that the first row segments of the group of rows do not store the same data, then the corresponding interconnect circuit can selectively enable the second row segment of each row of the group only in response to match results in the first row segment of the same row.

FIG. 1 is a block diagram illustrating the general architecture of a CAM device 100 within which the present embodiments can be implemented. CAM device 100 includes a CAM array 110, an address decoder 120, a comparand register 130, a read/write circuit 140, a priority encoder circuit 150, and match logic 160. CAM array 110 includes any number of rows of CAM cells (not shown for simplicity in FIG. 1), where each row of CAM cells can be configured to store a data word. Further, while CAM array 110 is shown in FIG. 1 as a single CAM array, it may include any number of CAM array blocks that can be independently searched.

One or more instructions and related control signals can be provided to CAM device 100 from an instruction decoder (not shown for simplicity) to control read, write, compare, and other operations for CAM device 100. Other well-known signals that can be provided to CAM device 100, such as enable signals, clock signals, and power connections, are not shown for simplicity. Further, although not shown in FIG. 1, each row of CAM cells in CAM array 110 may have one or more validity bits to indicate whether the corresponding row (or any segment thereof) of CAM cells stores valid data.

Each row of CAM cells (not shown in FIG. 1 for simplicity) in CAM array 110 is coupled to address decoder 120 via a corresponding word line WL, and to match latches 112, to priority encoder 150, and to match logic 160 via a corresponding match line ML. For simplicity, the word lines and match lines are represented collectively in FIG. 1. Address decoder 120 is well-known, and includes circuitry to select corresponding rows in CAM array 110 for read, write, and/or other operations in response to an address received from an address bus ABUS using the word lines WL. For other embodiments, addresses can be provided to address decoder 120 from another suitable bus and/or circuitry.

The match lines ML provide match results for compare operations between comparand data (e.g., a search key) and data stored in CAM array 110. Priority encoder 150, which is well-known, uses the match results indicated on the match lines and latched in the match latches 112 to determine the matching entry that has the highest priority number associated with it and generates the index or address of this highest priority match (HPM). In addition, priority encoder 150 can use the validity bits from CAM array 110 to generate the next free address that is available in CAM array 110 for storing new data. Although not shown in FIG. 1, for some embodiments, priority encoder 150 can provide the next free address to the address decoder 120.

Match logic 160, which is well-known, uses the match results indicated on the match lines to generate a match flag indicative of a match condition in CAM array 110. If there is more than one matching entry in CAM array 110, match logic 160 can generate a multiple match flag to indicate a multiple match condition. In addition, match logic 160 can use the validity bits from CAM array 110 to assert a full flag when all of the rows of CAM cells in CAM array 110 are filled with valid entries.

Each column of CAM cells (not shown in FIG. 1 for simplicity) in CAM array 110 is coupled to comparand register 130 via one or more corresponding comparand lines CL, and is coupled to read/write circuit 140 via one or more corresponding bit lines BL. For simplicity, the comparand lines CL and bit lines BL are represented collectively in FIG. 1. Comparand register 130 is well-known, and is configured to provide a search key (e.g., a comparand word) received from a comparand bus CBUS to CAM array 110 during compare operations with data stored therein. For other embodiments, the search key can be provided to CAM array 110 via another bus and/or circuit. Read/write circuit 140 includes well-known write drivers to write data received from a data bus DBUS to CAM array 110 via the bit lines, and includes well-known sense amplifiers to read data from CAM array 110 onto DBUS. For other embodiments, read/write circuit 140 can be coupled to a bus other than DBUS. Further, although not shown in FIG. 1 for simplicity, CAM device 100 can include a well-known global mask circuit (e.g., coupled to the comparand register 130) that can selectively mask the bits of the search key provided to the CAM array 110.

Figure 2:
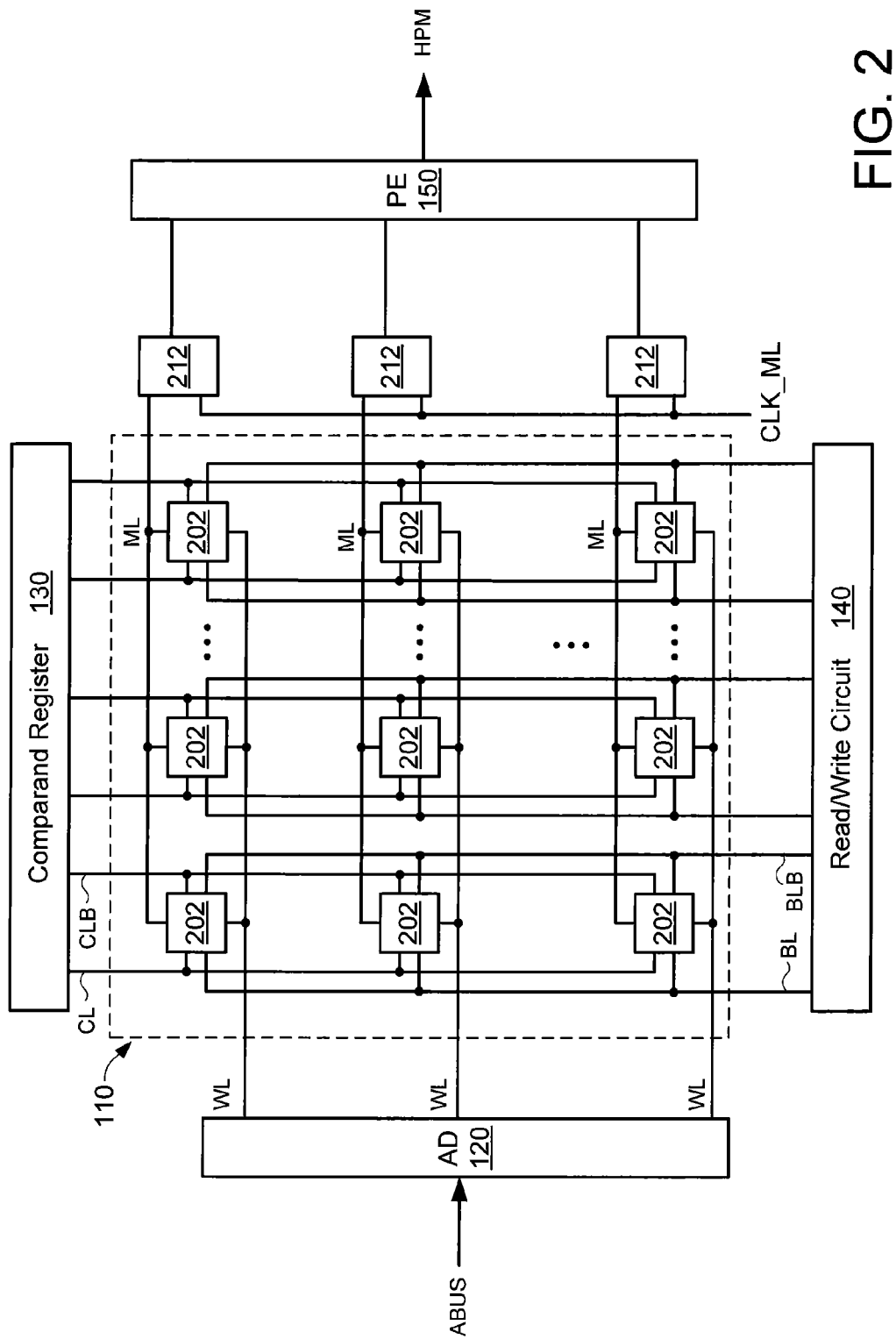
FIG. 2 is a block diagram of one embodiment of the CAM array of FIG. 1.

FIG. 2 is a more detailed block diagram of the CAM array 110 of FIG. 1. CAM array 110 is shown to include a plurality of CAM cells 202 organized in any number of rows and columns. The CAM cells 202 can be any suitable type of CAM cell including, for example, binary CAM cells, ternary CAM cells, and/or quaternary CAM cells. As noted above, each row of CAM array 110 may also include one or more validity bits. Each row of CAM cells 202 is coupled to a match line ML and to a word line WL. Each word line WL is driven by address decoder 120 (see also FIG. 1) to select one or more rows of CAM cells 202 for writing or reading. Each match line ML is coupled to priority encoder 150 via a corresponding match latch 212, which together form the match latches 112 of FIG. 1. Each column of CAM cells 202 in CAM array 110 is coupled to read/write circuit 140 via a complementary bit line pair BL/BLB, and to comparand register 130 via a complementary comparand line pair CL/CLB.

Prior to compare operations, the match lines are pre-charged (e.g., to logic high or towards the supply voltage VDD), and each set of complementary comparand line pairs CL/CLB are driven to the same predetermined logic level (e.g., to logic low). Then, during compare operations, the comparand register 130 provides the search key (i.e., the comparand word) to the CAM cells 202 by driving each pair of complementary comparand lines CL/CLB to opposite logic states indicative of the corresponding bit of the search key. For example, to provide a logic low comparand bit to a column of CAM cells, the corresponding comparand line CL is driven to a first logic state (e.g., logic low) and the corresponding complementary comparand line CLB is driven to a second logic state (e.g., logic high); conversely, to provide a logic high comparand bit to the column of CAM cells, the corresponding comparand line CL is driven to the second logic state (e.g., logic high) and the corresponding complementary comparand line CLB is driven to the first logic state (e.g., logic low). Thereafter, if all the CAM cells 202 in a particular row match the corresponding bits of the search key, then the match line ML remains in its logic high state to indicate the match condition. Conversely, if one or more of the CAM cells 202 in the row do not match the corresponding bit of the search key, then mismatching CAM cells 202 discharge the match line (e.g., towards ground potential) to indicate the mismatch condition.

Figure 3A:
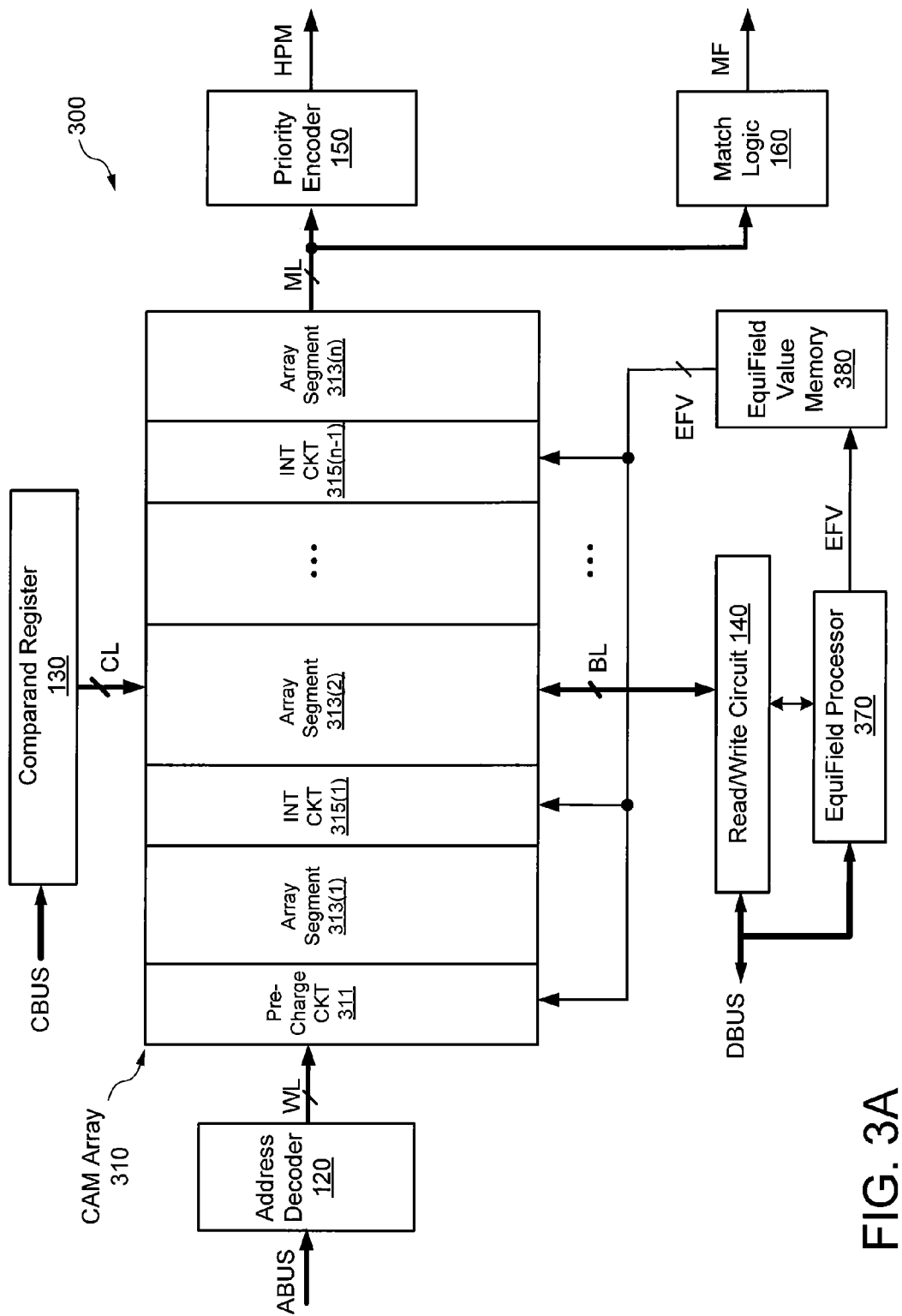
FIG. 3A is a more detailed block diagram of a CAM device having a number of cascaded CAM row segments and an interconnect circuit in accordance with some embodiments.

FIG. 3A is a more detailed block diagram of a CAM device 300 in accordance with the present embodiments. CAM device 300 includes a partitioned CAM array 310, address decoder 120, comparand register 130, read/write circuit 140, priority encoder 150, match logic 160, an equi-field processor 370, and an equi-field value memory 380. The partitioned CAM array 310 is coupled to address decoder 120 via word lines WL, to comparand register 130 via comparand lines CL, and to read/write circuit 140 via bit lines BL. Comparand lines CL and bit lines BL each include any number of pairs of complimentary signal lines (not shown for simplicity in FIG. 3A). Address decoder 120, comparand register 130, read/write circuit 140, priority encoder 150, and match logic 160 operate in the same manner as described above with respect to FIG. 1. One or more instructions and related control signals may be provided to CAM device 300 from an instruction decoder (not shown for simplicity) to control read, write, compare, and other operations for CAM device 300. Other well-known signals that can be provided to CAM device 300, such as enable signals, clock signals, and power connections, are not shown for simplicity. Further, although not shown in FIG. 3A, each row of CAM cells in CAM array 310 may have one or more validity bits to indicate whether the corresponding row (or any segment thereof) of CAM cells stores valid data.

The equi-field processor 370 includes an input to receive data to be stored in the CAM array and includes an output to generate a number of equi-field values (EFV) that each indicate whether the first row segments of a corresponding group of selected rows store the same data. For some embodiments, the equi-field processor 370 can analyze the data before it is written to the CAM array to identify groups of data entries that share a common prefix value (e.g., a most significant number of bits corresponding to the width of the first row segments 313(1)), and then can store the data entries in the CAM array in an ordered manner that ensures that groups of data entries sharing a common prefix value are stored in a corresponding group of adjacent or contiguous rows. For other embodiments, the equi-field processor 370 can analyze the contents of the first CAM array segment 313(1) to determine which rows store the same data, and can then identify groups of rows that store the same data in their first row segments. For one such embodiment, the equi-field processor 370 can be configured to re-order entries in the CAM array 310 so that groups of entries that share a common first portion (e.g., a common prefix) are stored in corresponding groups of adjacent rows. Thus, although not shown in FIG. 3A for simplicity, the equi-field processor 370 can include ports coupled to CAM array 310.

The equi-field memory 380, which can be any suitable type of memory device (e.g., DRAM, SRAM, Flash memory, EEPROM, and so on) includes an input to receive EFV's from the equi-field processor 370, a plurality of storage locations each for storing the EFV for a corresponding group of selected rows, and an output coupled to the pre-charge circuits 311 and to the interconnect circuits 315(1)-315(n−1). For some embodiments, the equi-field memory 380 can be formed as part of the equi-field processor 370. For some embodiments, the equi-field memory 380 is distributed across the CAM array 310 (e.g., using SRAM cells integrated into the CAM array 310 and/or unused portions of CAM cells in the CAM array 310, for example unused portions of CAM cells for validity bits). For other embodiments, the equi-field processor 370 and/or equi-field memory 380 can be formed separate from the CAM device 300.

CAM array 310 includes pre-charge circuits 311, a plurality of CAM array segments 313(1)-313(n), and a number of programmable match line segment interconnect circuits 315(1)-315(n−1) that can either span across the entire array or can be divided into segments that each spans across a selected number of associated rows of the array. Thus, although not shown for simplicity in FIG. 3A, each row of CAM array 310 is coupled to a corresponding one of the pre-charge circuits 311 and includes a plurality of row segments each having a plurality of CAM cells coupled to an associated match line segment, as described in more detail below with respect to FIG. 4A. The match line segments of the last array segment 313(n) provide match results for the array 310 to priority encoder 150 and match logic 160.

As indicated above, each array segment 313 stores a corresponding field or portion of the data words stored in CAM array 310. Thus, a respective row of CAM array 310 stores a data word, and each segment of the respective row stores a corresponding field or portion of the data word. For some embodiments, one or more fields of the data word can be a set of data bits corresponding to a shared prefix value determined by the equi-field processor 370. For other embodiments, each field can be a set of data bits that form a tuple or a range in a packet classification application. For such other embodiments, each field of the data word can correspond to a portion (e.g., source address, destination address, and so on) of a packet classification entry stored in the CAM array 310.

The pre-charge circuits 311 selectively pre-charge the match line segments of the first CAM array segment 313(1) in response to the equi-field values (EFV) provided by the EFV memory 380. For some embodiments, if the first row segments of a group of selected rows store the same data, then the EFV's provided to the pre-charge circuits 311 associated with the group of selected rows cause the pre-charge circuits 311 to pre-charge a designated one of the first match line segments while disabling the other first match line segments in the group of selected rows. Conversely, for each row that does not store the same data in its first row segment as one or more other rows in a group, then the corresponding EFV causes the associated pre-charge circuit 311 to charge the first match line segment of the row.

Each of interconnect circuits 315(1)-315(n−1) has first inputs coupled to the match line segments of a previous CAM array segment 313, second inputs to receive equi-field values (EFV) from the EFV memory 380, and outputs coupled to the match line segments in the next CAM array segment 313, and is configured to selectively route the match results from the previous array segment to the next array segment in response to a corresponding one of the EFVs. More specifically, in response to the EFV, a respective interconnect circuit 315 either (1) selectively enables the next segment of each particular row in response to match conditions in the previous segment of the same particular row or (2) selectively enables the next segments of a selected group of rows in response to match conditions in the previous segment of a designated one of the rows of the selected group. For example, if the EFV indicates that the first row segments of a group of rows each store different data, then the corresponding interconnect circuit 315 enables the second segment of each row in the group only if the first segment of the same row indicates a match condition. Thus, for each row whose first segment does not have a match condition, the interconnect circuit 315 disables the second segment of the row. Conversely, if the EFV indicates that the first row segments of a group of rows each store the same data, then the corresponding interconnect circuit 315 enables the second segments of all the rows in the group if the first row segment of a designated one of the rows in the group has a match condition. Thus, if the first row segment of the designated row does not have a match condition, then the interconnect circuit 35 disables the second row segments of all the rows in the group.

For some embodiments, the interconnect circuits 315 enable subsequent row segments by pre-charging their associated match line segments, and disable subsequent row segments by not pre-charging their associated match line segments. Thus, for such embodiments, the interconnect circuits 315 can include match line pre-charge circuits, which can either be of the same type as pre-charge circuits 311 or can be any suitable type of match line pre-charge circuit. For one embodiment, pre-charge circuits 311 can be of the type disclosed in commonly-owned U.S. Pat. No. 6,243,280, the entirety of which is incorporated by reference herein. For another embodiment, pre-charge circuits 311 can be of the type disclosed in commonly-owned U.S. Pat. No. 7,920,398, the entirety of which is incorporated by reference herein.

Figure 3B:
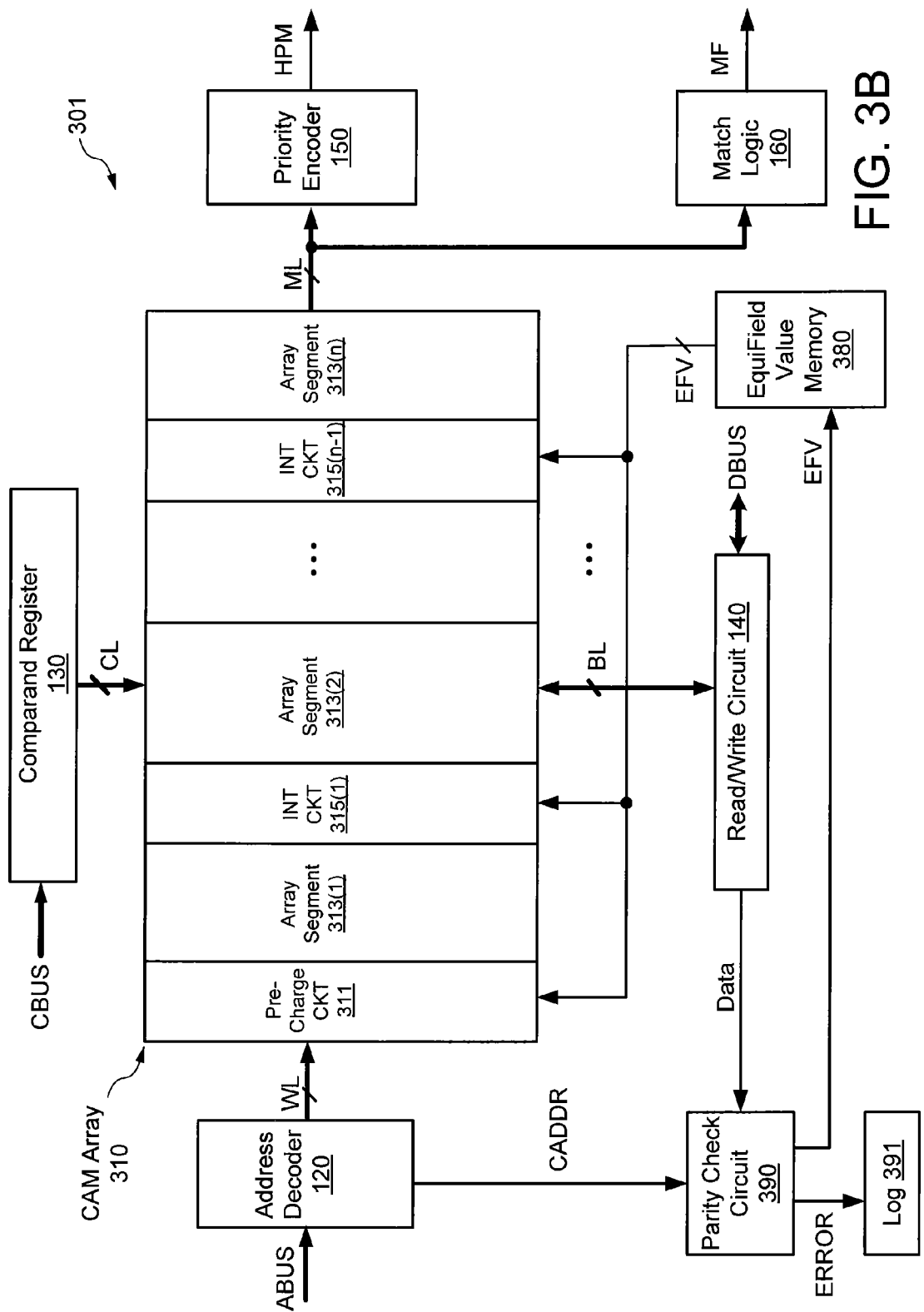
FIG. 3B is a more detailed block diagram of a CAM device having a number of cascaded CAM row segments and an interconnect circuit in accordance with other embodiments.

For other embodiments, the operations performed by equi-field processor 370 can instead be performed by an error checking circuit such as a parity check circuit. For example, FIG. 3B shows a CAM device 301 in accordance with other embodiments. CAM device 301 includes all the components of CAM device 300 of FIG. 3A, except that the operations performed by equi-field processor 370 are performed by a parity check circuit 390. As shown in FIG. 3B, parity check circuit 390, which can be used to detect errors in data words stored in CAM array 310 during well-known error checking operations, includes a first input to receive an error check address (CADDR) from address decoder 120, a second input to receive data words and parity bits (not shown for simplicity) read from CAM array 310 by read/write circuit 140, a first output to provide error signals to an error log memory 391, and a second output to provide the EFVs to equi-field value memory 380. During error checking operations, the parity check circuit 390 compares the parity value of a data word read from a row of CAM array 310 (e.g., selected by CADDR) with a calculated parity value to determine whether there is an error associated with the storage of the data word in the selected row of CAM array 310. Upon detecting an error, the parity check circuit 390 outputs an error address and asserts an error flag signal (not shown for simplicity) to log 391 for error logging purposes. The parity check circuit 390 can operate in the background, independent of other CAM operations, to check data stored in CAM array 310 for errors in a row-by-row manner, thereby allowing error checking operations to be performed concurrently with compare operations. For some embodiments, parity check circuit 390 can be of the type disclosed in commonly-owned U.S. Pat. No. 7,237,156, the entirety of which is incorporated herein by reference.

In accordance with the present embodiments, parity check circuit 390 can also be configured to generate the equi-field values (EFVs) associated with data words stored in CAM array 310. More specifically, for some embodiments, the parity check circuit 390 can be configured to compare the data word read from a previous row with the data word read from a current row to determine whether any portions of the two data words are the same, and to generate the EFVs accordingly. Thus, during error checking operations, the parity check circuit 390 can compare successive data words read from sequential rows of CAM array 310 to generate the EFVs. In this manner, existing error checking circuitry (e.g., parity check circuit 390) within CAM device 301 can be used to generate the EFVs, thereby allowing the separate equi-field processor 370 of FIG. 3A to be omitted. In addition to conserving silicon area, using the parity check circuit 390 to generate the EFVs allows data stored in CAM array 301 to be analyzed for similarities without end users of CAM device 301 having to know how such data is analyzed and stored in CAM array 310. Thus, the parity check circuit 390 can serve as an interface between CAM device 301 and its users to allow data to be stored and/or re-ordered in CAM array 301 in a manner that is transparent to the user.

Figure 4A:
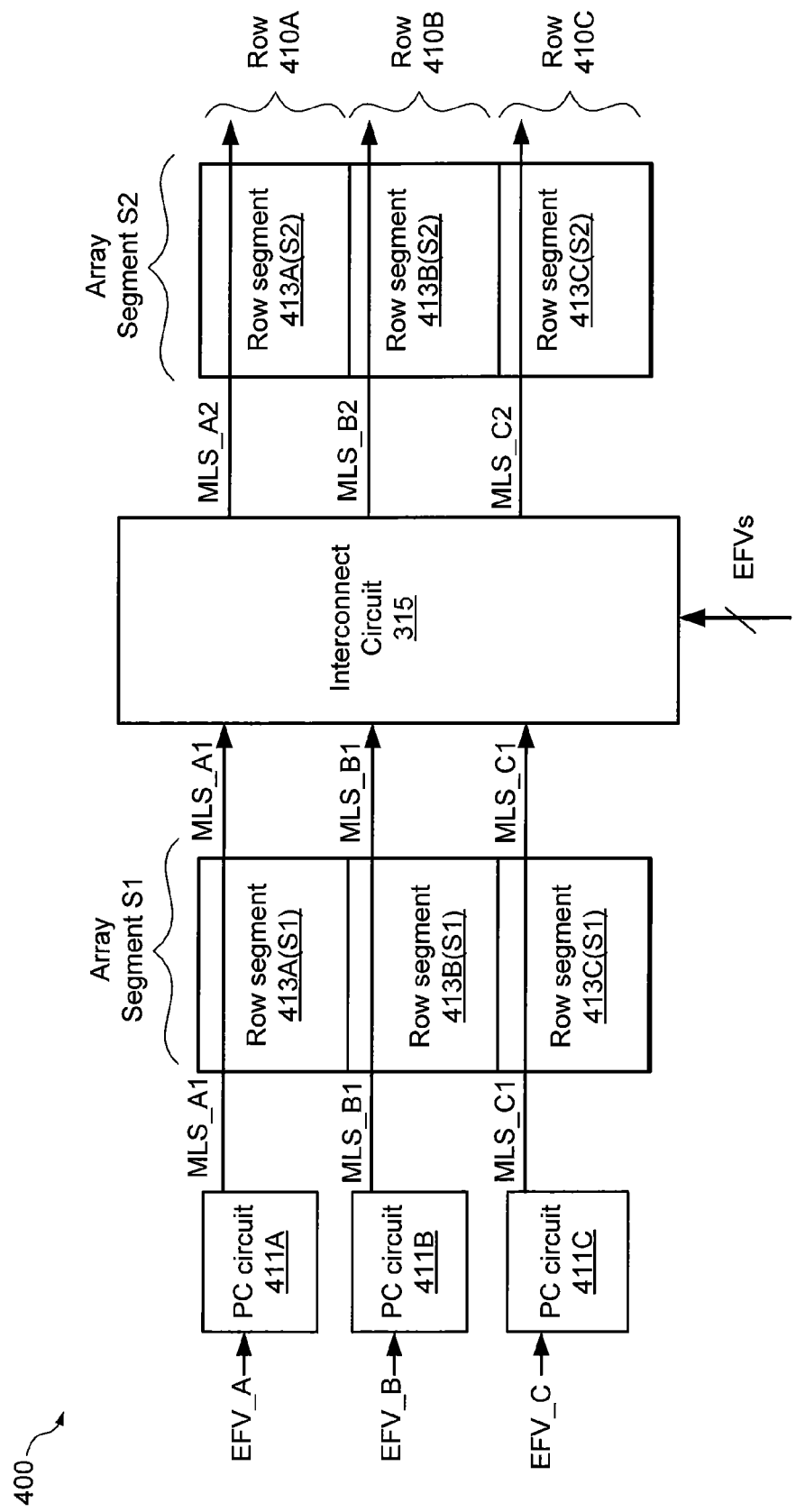
FIG. 4A is a more detailed block diagram of a portion of the CAM array of FIG. 3A in accordance with some embodiments.

FIG. 4A is a more detailed block diagram of a portion of a CAM array 400 that is one embodiment of CAM array 310 of FIG. 3A in accordance with some embodiments. For purposes of discussion herein, CAM array 400 is shown in FIG. 4A to include a group of 3 CAM rows 410A-410C that span across two array segments S1 and S2, 3 pre-charge circuits 411A-411C, and one interconnect circuit 315. Of course, for actual embodiments, CAM array 400 can include any number of rows 410, CAM array segments, and/or corresponding interconnect circuits 415.

Each row 410 of CAM array 400 includes an associated pre-charge circuit 411 and two row segments S1 and S2 coupled to interconnect circuit 315. Although not shown in FIG. 4A for simplicity, each row segment S1 and S2 can include any number of CAM cells coupled to a corresponding match line segment MLS. For example, the first row 410A includes a pre-charge circuit 411A, a first row segment 413A (S1), and a second row segment 413A(S2). The first pre-charge circuit 411A includes an input to receive a first equi-field value (EFV_A), and includes an output to selectively charge the first match line segment MLS_A1 of the first CAM row 410A. The second row 410B includes a pre-charge circuit 411B, a first row segment 413B(S1), and a second row segment 413B(S2). The second pre-charge circuit 411B includes an input to receive a second equi-field value (EFV_B), and includes an output to selectively charge the first match line segment MLS_B1 of the second CAM row 410B. The third row 410C includes a pre-charge circuit 411C, a first row segment 413C(S1), and a second row segment 413C(S2). The third pre-charge circuit 411C includes an input to receive a third equi-field value (EFV_C), and includes an output to selectively charge the third match line segment MLS_C1 of the third CAM row 410C. The interconnect circuit 315 includes first inputs coupled to the first match line segments MLS_A1, MLS_B1, and MLS_C1 of the first array segment S1, second inputs to receive the equi-field values (EFVs), and outputs coupled to the second match line segments MLS_A2, MLS_B2, and MLS_C2 of the second array segment S2. For the exemplary portion of CAM array 400 of FIG. 4A, the second match line segments MLS_A2, MLS_B2, and MLS_C2 provide match results for corresponding rows 410A, 410B, and 410C, respectively.

As discussed above, the equi-field values (EFVs) indicate whether the first row segments of CAM array 400 store the same data, and can be used to reduce power consumption during a compare operation between a search key and data stored in the CAM array. More specifically, during the compare operation, the EFVs can be used to determine (1) whether to enable a designated one of the first row segments 413A(S1), 413B(S1), and 413C(S1) or to enable all of the first row segments and (2) whether interconnect circuit 315 selectively enables all of second row segments 413A(S2), 413B (S2), and 413C(S2) in response to match conditions in the designated first row segment or selectively enables each of the second row segments 413A(S2), 413B(S2), and 413C(S2) in response to match conditions in respective first row segments 413A(S1), 413B(S1), and 413C(S1) of the same row.

Figure 4B:
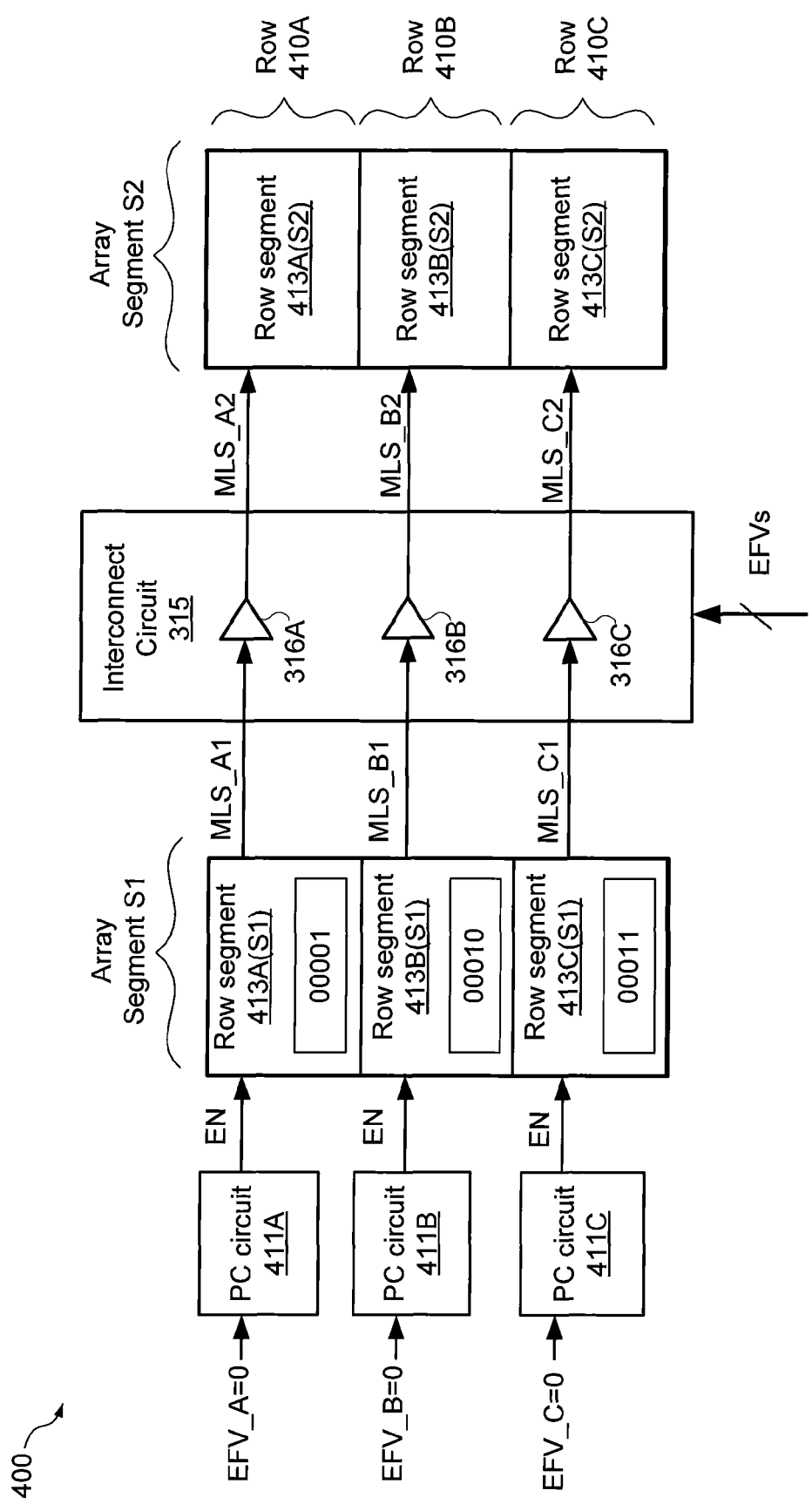
FIG. 4B is a block diagram of the CAM array of FIG. 4A depicting a configuration in which the first row segments of the rows store different data.

If the first row segments of CAM array 400 do not store the same data, as depicted in FIG. 4B, then the EFVs are set to states that cause rows 410A-410C to operate independently of one another during the compare operation. For example, the exemplary embodiment shown in FIG. 4B depicts the first row segment 413A(S1) of first row 410A as storing a data value D1=00001, the first row segment 413B(S1) of second row 410B as storing a data value D2=00010, and the first row segment 413C(S1) of third row 410C as storing a data value D3=00011. Because the first row segments of rows 410A-410C store different data, the equi-field values for all three rows are set to a first state (e.g., EFV_A=0, EFV_B=0, and EFV=0) to indicate that the first row segments store different data. These states of EFV_A, EFV_B, and EFV_C cause pre-charge circuits 411A-411C to pre-charge the first match line segments of all three CAM rows 410A-410C. In this manner, the first row segments of all three CAM rows 410A-410C are enabled to participate in the compare operation (e.g., as indicated by the "EN" labels).

Thus, for the present example, EFV_A, EFV_B, and EFV_C are all set to 0 to indicate that their first row segments store different data. More specifically, in response to EVF1=0, pre-charge circuit 411A pre-charges the first match line segment MLS_A1 of the first CAM row 410A, thereby enabling first row segment 413A(S1). Similarly, in response to EVF2=0, pre-charge circuit 411B pre-charges the first match line segment MLS_B1 of the second CAM row 410B to enable first row segment 413B(S1), and in response to EVF3=0, pre-charge circuit 411C pre-charges the first match line segment MLS_C1 of the third CAM row 410C, thereby enabling first row segment 413C(S1).

In addition, these EFV states (i.e., EFV_A=0, EFV_B=0, and EFV_C=0) cause interconnect circuit 315 to selectively pre-charge the second match line segment of each respective row 410 only in response to match conditions indicated on the first match line segment of the respective row 410. For example, in response to EFV[A:C]=0, interconnect circuit 315 selectively pre-charges the second match line segment MLS_A2 of first row 410A in response to match results on the first match line segment MLS_A1 of first CAM row 410A, selectively pre-charges the second match line segment MLS_B2 of second row 410B in response to match results on the first match line segment MLS_B1 of second CAM row 410B, and selectively pre-charges the second match line segment MLS_C2 of third row 410C in response to match results on the first match line segment MLS_C1 of third CAM row 410C. This configuration of interconnect circuit 315 (e.g., in response to EFV[A:C]=0) is depicted in FIG. 4B by the buffer circuits 316A-316C that, for each CAM row 410A-410C, selectively pre-charge the second match line segment of the row in response to match conditions in the first segment of the row. In this manner, the second match line segment of a respective row 410 is pre-charged only if there is a match condition in the first segment of the respective row. Accordingly, if there is not a match condition in the first row segment of a respective CAM row 410, then interconnect circuit 315 disables the second row segment of the respective CAM row 410, thereby reducing power consumption.

Figure 4C:
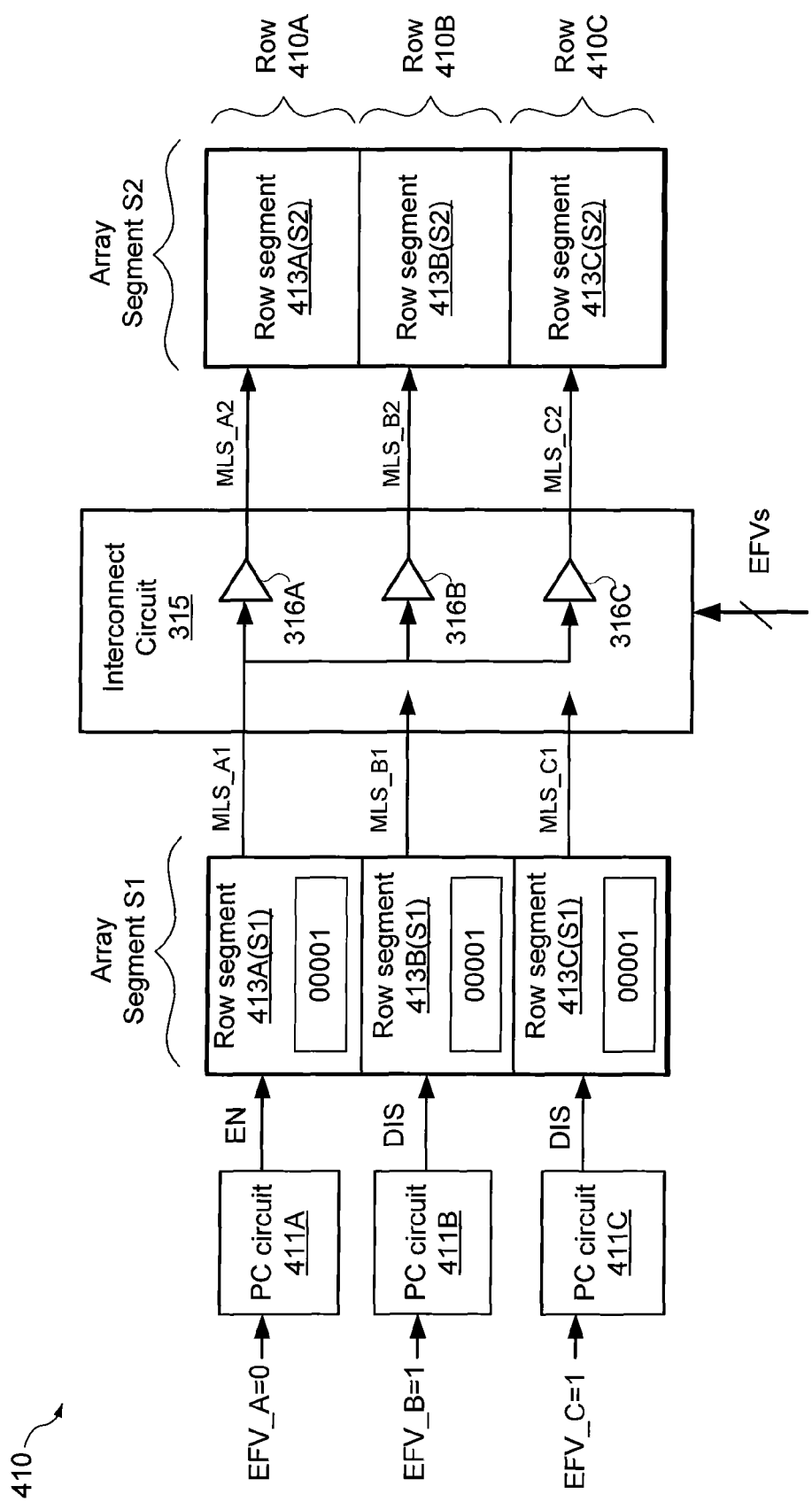
FIG. 4C is a block diagram of the CAM array of FIG. 4A depicting a configuration in which the first row segments of the rows store the same data.

Conversely, if the first row segments of CAM array 400 store the same data, as depicted in FIG. 4C, then the EFVs are set to states that select the first row segment of a designated one of the CAM rows 410A-410C to participate in the compare operation while disabling the first row segments of the other (e.g., non-designated) CAM rows 410 to reduce power consumption. For example, the exemplary embodiment shown in FIG. 4C depicts the first row segments of all three CAM rows 410A-410C as storing the same data value D1=00001, and therefore the match results will be the same for all three first row segments 413A(S1), 413B(S1), and 413C(S1), irrespective of the search key. Thus, to reduce power consumption associated with charging and discharging the match lines for compare operations, the match results of the first row segment of a designated one of the CAM rows can be used to represent the match results of the first row segments of all the CAM rows in the group.

For the present example, EFV_A is set to 0 to enable the first row segment 413A(S1) of the first CAM row 410A for the compare operation, and EFV_B and EFV_C are set to 1 to disable the first row segments 413B(S1) and 413C(S1) of the second and third CAM rows 410B and 410C, respectively. Thus, for the exemplary embodiment of FIG. 4C, setting EFV_B=1 indicates that the first row segment of the second CAM row 410B stores the same data as the first row segment of the first CAM row 410A, and setting EFV_C=1 indicates that the first row segment of the third CAM row 410C stores the same data as the first row segment of the first CAM row 410A.

More specifically, in response to EVF1=0, pre-charge circuit 411A pre-charges the first match line segment MLS_A1 of the first CAM row 410A, thereby enabling first row segment 413A(S1). In response to EVF2=1, pre-charge circuit 411B does not pre-charge the first match line segment MLS_B1 of the second CAM row 410B, thereby disabling first row segment 413B(S1) of second CAM row 410B. Similarly, in response to EVF3=1, pre-charge circuit 411C does not pre-charge the first match line segment MLS_C1 of the third CAM row 410C, thereby disabling first row segment 413C(S1) of third CAM row 410C. In this manner, only the first row segment of the first CAM row 410A is enabled for the compare operation (e.g., as indicated by the "EN" label), while the first row segments of the second and third CAM rows 410B and 410C are disabled (e.g., as indicated by the "DIS" labels), thereby reducing power consumption by not pre-charging the first match line segments associated with the second and third CAM rows 410B and 410C.

In addition, these EFV states (i.e., EFV_A=0, EFV_B=1, and EFV_C=1) cause interconnect circuit 315 to selectively pre-charge the second match line segments of all CAM rows 410A-410C in the group in response to match conditions indicated on the first match line segment of the designated CAM row 410A. Thus, for the exemplary embodiment of FIG. 4C, the interconnect circuit 315 routes the match results from the first segment of the designated first CAM row 410A as an enable signal to the second segments of all CAM rows 410A-410C, and ignores signals on the first match line segments in the non-designated CAM rows 410B and 410C. Accordingly, interconnect circuit 315 selectively pre-charges the second match line segments of all three CAM rows 410A-410C in response to match results on the first match line segment MLS_A1 of the first CAM row 410A. This configuration of interconnect circuit 315 is depicted in FIG. 4C by the first match line segment MLS_A1 driving the inputs of all three buffer circuits 316A-316C, for example, so that second match line segments MLS_A2, MLS_B2, and MLS_C2 are all pre-charged (e.g., enabled) if there is a match condition in the designated first row segment 413A(S1), and conversely are all not pre-charged (e.g., disabled) if there is a mismatch condition in the designated first row segment 413A(S1). Accordingly, if there is a match condition in the first row segment of designated CAM row 410A, then interconnect circuit 315 enables the second row segments of all CAM rows 410A-410C, for example, by pre-charging corresponding second match line segments MLS_A2, MLS_B2, and MLS_C2. Conversely, if there is not a match condition in the first row segment of designated CAM row 410A, then interconnect circuit 315 disables the second row segments of all CAM rows 410A-410C, for example, by not pre-charging corresponding second match line segments MLS_A2, MLS_B2, and MLS_C2, thereby reducing power consumption.

FIG. 5A is a more detailed block diagram of an interconnect circuit 500 that is one embodiment of the interconnect circuit 315 of FIG. 4A. For consistency with the examples described above with respect to FIGS. 4A-4C, interconnect circuit 500 is depicted as including components that can selectively connect the first and second match line segments of three CAM rows 410A-410C together in response to the EFVs. Of course, for other embodiments, interconnect circuit 500 can be expanded to selectively connect the match line segments of any number of row together.

As shown in FIG. 5A, interconnect circuit 500 includes a buffer 502 and two multiplexers (MUXes) 510B and 510C. Buffer 502, which can be or include any suitable buffer or driver circuit, has an input coupled to the first match line segment MLS_A1 of CAM row 410A, and has an output coupled to the second match line segment MLS_A2 of CAM row 410A. MUX 510B has a first input coupled to the first match line segment MLS_A1 of CAM row 410A, a second input coupled to the first match line segment MLS_B1 of CAM row 410B, a control input to receive EFV_B, and an output coupled to the second match line segment MLS_B2 of CAM row 410B. MUX 510C has a first input coupled to the first match line segment MLS_A1 of CAM row 410A, a second input coupled to the first match line segment MLS_C1 of CAM row 410C, a control input to receive EFV_C, and an output coupled to the second match line segment MLS_C2 of CAM row 410C.

During compare operations, buffer 502 selectively pre-charges the second match line segment MLS_A2 of CAM row 410A in response to match conditions indicated on the first match line segment MLS_A1 of CAM row 410A. Thus, for example, if the first row segment of CAM row 410A indicates a match condition, then buffer 502 pre-charges the second match line segment MLS_A2 of CAM row 410A. Conversely, if the first row segment of CAM row 410A indicates a mismatch condition, then buffer 502 does not pre-charge the second match line segment MLS_A2 of CAM row 410A, thereby indicating a mismatch for CAM row 410A without having to perform compare operations in the second row segment of CAM row 410A. For some embodiments, buffer 502 can include a pre-charge circuit of the type shown in FIG. 4A.

MUX 510B selectively enables the second row segment of second CAM row 410B in response to either (1) match conditions indicated on the first match line segment MLS_A1 of first CAM row 410A or (2) match conditions indicated on the first match line segment MLS_B1 of second CAM row 410B, depending upon the state of EFV_B. Thus, if EFV_B=1 (e.g., indicating that the first segment of row 410B stores the same data as the first segment of row 410A), then MUX 510B selectively pre-charges the second match line segment MLS_B2 of row 410B in response to match conditions in the first row segment of CAM row 410A. More specifically, if the first row segment of CAM row 410A indicates a match condition, then MUX 510B pre-charges the second match line segment MLS_B2 of CAM row 410B. On the other hand, if the first row segment of CAM row 410A indicates a mismatch condition, then MUX 510B does not pre-charge the second match line segment MLS_B2 of CAM row 410B. Conversely, if EFV_B=0 (e.g., indicating that the first segment of row 410B does not store the same data as the first segment of row 410A), then MUX 510B selectively pre-charges the second match line segment MLS_B2 of row 410B in response to match conditions in the first row segment of the same CAM row 410B. More specifically, if the first row segment of CAM row 410B indicates a match condition, then MUX 510B pre-charges the second match line segment MLS_B2 of CAM row 410B. On the other hand, if the first row segment of CAM row 410B indicates a mismatch condition, then MUX 510B does not pre-charge the second match line segment MLS_B2 of CAM row 410B.

MUX 510C selectively enables the second row segment of third CAM row 410C in response to either (1) match conditions indicated on the first match line segment MLS_A1 of first CAM row 410A or (2) match conditions indicated on the first match line segment MLS_C1 of third CAM row 410C, depending upon the state of EFV_C. Thus, if EFV_C=1 (e.g., indicating that the first segment of row 410C stores the same data as the first segment of row 410A), then MUX 510C selectively pre-charges the second match line segment MLS_C2 of row 410C in response to match conditions in the first row segment of CAM row 410A. More specifically, if the first row segment of CAM row 410A indicates a match condition, then MUX 510C pre-charges the second match line segment MLS_C2 of CAM row 410C. On the other hand, if the first row segment of CAM row 410A indicates a mismatch condition, then MUX 510C does not pre-charge the second match line segment MLS_C2 of CAM row 410C. Conversely, if EFV_C=0 (e.g., indicating that the first segment of row 410C does not store the same data as the first segment of row 410A), then MUX 510C selectively pre-charges the second match line segment MLS_C2 of row 410C in response to match conditions in the first row segment of the same CAM row 410C. More specifically, if the first row segment of CAM row 410C indicates a match condition, then MUX 510C precharges the second match line segment MLS_C2 of CAM row 410C. On the other hand, if the first row segment of CAM row 410C indicates a mismatch condition, then MUX 510C does not pre-charge the second match line segment MLS_C2 of CAM row 410C.

Figure 5B:
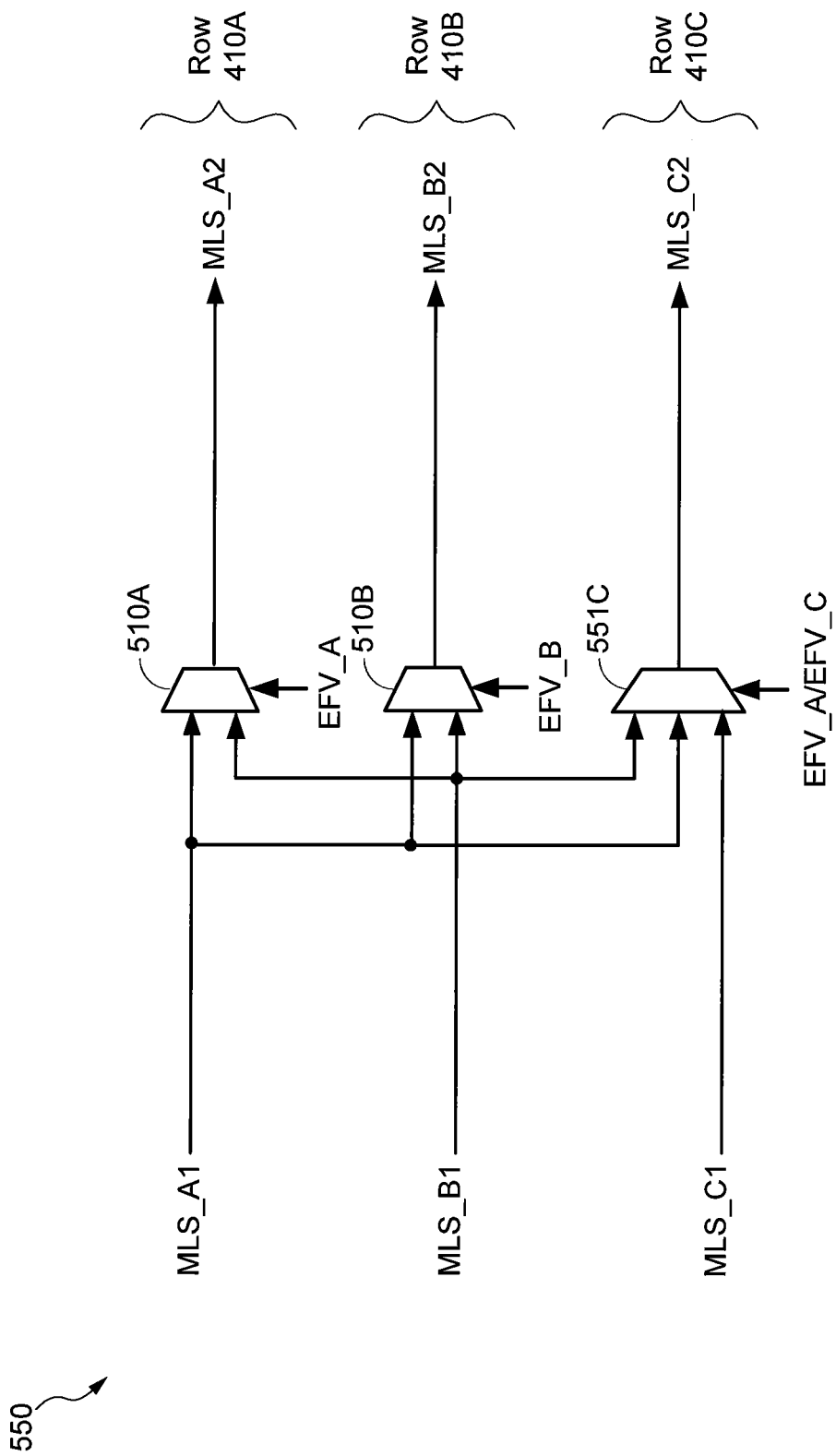
FIG. 5B is a more detailed block diagram of another embodiment of the interconnect circuit of FIG. 4A.

The exemplary embodiment of FIG. 5A can be modified to allow the second segment of the third CAM row 410C to be selectively enabled in response to match conditions in the first row segment of any of the 3 CAM rows 410A-410C, for example, as depicted in FIG. 5B. Thus, referring now to FIG. 5B, an interconnect circuit 550 is shown that is another embodiment of the interconnect circuit 315 of FIG. 4A. Interconnect circuit 550 of FIG. 5B is similar to interconnect circuit 500 of FIG. 5A, except that the 2-input MUX 510C is replaced by a 3-input MUX 551C that has a first input coupled to the first match line segment MLS_A1 of CAM row 410A, a second input coupled to the first match line segment MLS_B1 of CAM row 410B, a third input coupled to the first match line segment MLS_C1 of CAM row 410C, a control input to receive EFV_B and EFV_C, and an output coupled to the second match line segment MLS_C2 of CAM row 410C. In addition, while interconnect circuit 500 includes a driver 502, interconnect circuit 550 includes a MUX 510A. Operation of MUX 551C is similar to that of MUX 510C of FIG. 5A, except that MUX 511C can selectively route match results from the first row segment of either first row 410A, second row 410B, or third row 410C to the second row segment of third row 410C.

More specifically, MUX 510C selectively enables the second row segment of third CAM row 410C in response to either (1) match conditions indicated on the first match line segment MLS_A1 of first CAM row 410A, (2) match conditions indicated on the first match line segment MLS_B1 of second CAM row 410B, or (3) match conditions indicated on the first match line segment MLS_C1 of third CAM row 410A depending upon a logical combination of the states of EFV_B and EFV_C. For example, for MUX 551C to route the match results from the first row segment of third row 410C to the second row segment of the same row 410C, EFV_C can be set to logic 0; for MUX 551C to route the match results from the first row segment of second row 410B to the second row segment of third row 410C, EFV_C can be set to logic 1 and EFV_B can be set to logic 0; and for MUX 551C to route the match results from the first row segment of first row 410A to the second row segment of third row 410C, EFV_C can be set to logic 1 and EFV_B can be set to logic 1. Of course, for other embodiments, the interconnect circuit 550 can include MUXes having greater numbers of inputs that selectively enable the second segment of a respective CAM row in response to match conditions in the first segments of a greater number of rows.

Figure 6:
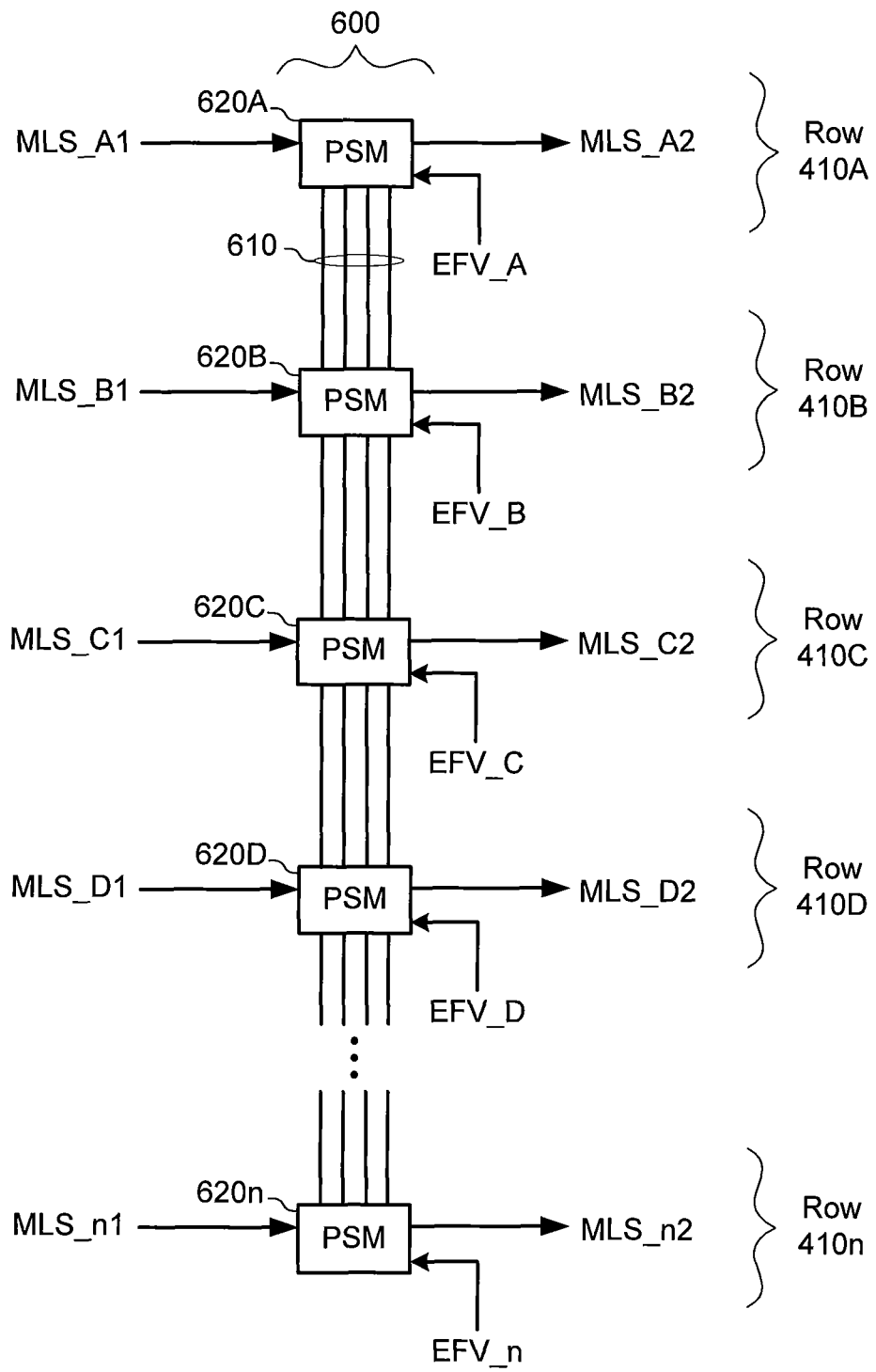
FIG. 6 is a more detailed block diagram of yet another embodiment of the interconnect circuit of FIG. 4A.

FIG. 6 shows an interconnect circuit 600 that is yet another embodiment of the interconnect circuit 315 of FIG. 4A. Interconnect circuit 600 is shown to include sets of four signal routing lines 610 and a plurality of programmable switch matrixes (PSMs) 620A-620n. The PSMs 620, which can be any well-known switching circuitry or logic such as a crossbar logic circuit, can be programmed to selectively connect signal routing lines 610 to the first match line segments and/or to the second match line segments of CAM rows 410A-410n in response to the EFV signals, thereby selectively enabling the second row segments of CAM rows 410A-410n in response to match conditions in the first row segments of CAM rows 410A-410n.

More specifically, PSM 620A includes an input coupled to the first match line segment MLS_A1 of first CAM row 410A, an output coupled to the second match line segment MLS_A2 of first CAM row 410A, ports coupled to signal routing lines 610, and a control input to receive a first set of equi-field values (EFV_A). PSM 620B includes an input coupled to the first match line segment MLS_B1 of second CAM row 410B, an output coupled to the second match line segment MLS_B2 of second CAM row 410B, ports coupled to signal routing lines 610, and a control input to receive a second set of equi-field values (EFV_B). The other PSMs 620C-620n are similarly connected.

In operation, each PSM 620 selectively couples a corresponding first match line segment MLS_x1 to one or more signal routing lines 610 and/or selectively couples a corresponding second match line segment MLS_x2 to one or more signal routing lines 610 in response to the associated set of equi-field values (EFV). For example, PSM 620A selectively couples first match line segment MLS_A1 to one or more signal routing lines 610 and/or selectively couples second match line segment MLS_A2 to first match line segment MLS_A1 or one or more signal routing lines 610 in response to EFV_A, PSM 620B selectively couples first match line segment MLS_B1 to one or more signal routing lines 610 and/or selectively couples second match line segment MLS_B2 to first match line segment MLS_B1 or one or more signal routing lines 610 in response to EFV_B, and so on. In this manner, interconnect circuit 600 can use the match results in the first row segment of any given CAM row 410 to selectively enable the second row segment(s) of one of more CAM rows 410 at the same time. For some embodiments, interconnect circuit 600 can be of the type disclosed in commonly-owned U.S. Pat. No. 7,643,353, the entirety of which is incorporated by reference herein.

Further, although the exemplary embodiment of interconnect circuit 600 is depicted in FIG. 6 as having 4 signal lines 610, for other embodiments, interconnect circuit 600 can have any number of signal routing lines sufficient to route match signals from the first match line segment of each CAM row to the second match line segment of the same CAM row and/or to the second match line segment of any number of other CAM rows at the same time.

While particular embodiments have been shown and described, it will be obvious to those skilled in the art that changes and modifications may be made without departing from this disclosure in its broader aspects and, therefore, the appended claims are to encompass within their scope all such changes and modifications as fall within the true spirit and scope of this disclosure.

Further, it should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media).

What is claimed is:

1. A content addressable memory (CAM) device having an array including a plurality of rows, wherein a respective row of the plurality of rows comprises:
   a first row segment including a number of first CAM cells coupled to a first match line segment; and
   a first circuit configured to selectively pre-charge the first match line segment in response to a value indicating whether data stored in the first row segment of the respective row is the same as data stored in the first row segment of another row.

2. The CAM device of claim 1, wherein:
   the first circuit is further configured to disable the first row segment of the respective row during a compare operation if the value indicates that data stored in the first row segment of the respective row is the same as data stored in the first row segment of the other row.

3. The CAM device of claim 1, wherein:
   the first circuit is further configured to enable the first row segment of the respective row during a compare operation if the value indicates that data stored in the first row segment of the respective row is not the same as data stored in the first row segment of the other row.

4. The CAM device of claim 1, further comprising:
   a second row segment including a number of second CAM cells coupled to a second match line segment; and
   a second circuit configured to selectively pre-charge the second match line segment of the respective row in response to match conditions in the first row segment of the other row if the value indicates that data stored in the first row segment of the respective row is the same as data stored in the first row segment of the other row.

5. The CAM device of claim 4, wherein the second circuit is further configured to selectively pre-charge the second match line segment of the other row during a compare operation.

6. The CAM device of claim 4, further comprising:
   an interconnect circuit having first inputs coupled to the first match line segments, second inputs to receive the values, and outputs coupled to the second match line segments.

7. The CAM device of claim 6, wherein the interconnect circuit is configured to selectively enable the second row segments in response to a combination of match conditions in the first row segments and the values.

8. The CAM device of claim 6, wherein the interconnect circuit is configured to selectively enable the second row segments of a group of rows in response to match conditions in the first row segment of a designated row of the group of rows if the value indicates that the first row segments of the group of rows store the same data.

9. The CAM device of claim 6, wherein the interconnect circuit includes a plurality of multiplexers, wherein a respective multiplexer of the plurality of multiplexers comprises:
   a first input coupled to the first match line segment of the respective row;
   a second input coupled to the first match line segment of the other row;
   an output coupled to the second match line segment of the respective row; and
   a control input to receive the value for the respective row.

10. The CAM device of claim 1, further comprising:
    a processor, having an input to receive data entries for the array and having first outputs coupled to the first circuits, configured to generate the values in response to a comparison between the data entries to be stored in the array.

11. The CAM device of claim 10, wherein the processor is further configured to store the data entries in the array in an order so that groups of data entries having common prefixes are stored in corresponding groups of adjacent rows of the array.

12. The CAM device of claim 10, wherein the processor further includes a second output coupled to an interconnect circuit spanning across all rows of the array.

13. The CAM device of claim 10, wherein the processor comprises a parity check circuit.

14. A content addressable memory (CAM) array having a plurality of rows, wherein a respective row of the plurality of rows comprises:
    a first row segment including a number of first CAM cells coupled to a first match line segment;
    a first circuit configured to selectively pre-charge the first match line segment in response to a value indicating whether data stored in the first row segment of the respective row is the same as data stored in the first row segment of another row;
    a second row segment including a number of second CAM cells coupled to a second match line segment; and
    a second circuit configured to selectively pre-charge the second match line segment of the respective row in response to a combination of match conditions in the first row segments and the value.

15. The CAM array of claim 14, wherein:
    if the value indicates that data stored in the first row segment of the respective row is the same as data stored in the first row segment of the other row, then the first circuit is configured to not pre-charge the first match line segment of the respective row.

16. The CAM array of claim 14, wherein:
    if the value indicates that data stored in the first row segment of the respective row is not the same as data stored in the first row segment of the other row, then the first circuit is configured to pre-charge the first match line segment of the respective row.

17. The CAM array of claim 14, wherein the second circuits associated with the plurality of rows together comprise an interconnect circuit having first inputs coupled to the first match line segments of the rows, second inputs to receive the values, and outputs coupled to the second match line segments of the rows.

18. The CAM array of claim 17, wherein the interconnect circuit is configured to selectively enable the second row segments of a group of rows in response to a combination of the value and match conditions in the first row segment of a designated row of the group of rows.

19. The CAM array of claim 17, wherein the interconnect circuit is configured to selectively enable the second row segments of a group of rows in response to match conditions in the first row segment of a designated row of the group of rows if the value indicates that the first row segments of the group of rows store the same data.

20. The CAM array of claim 17, wherein the interconnect circuit is configured to selectively enable the second row segment of a particular row only in response to match conditions in the first row segment of the particular row if the value indicates that the first row segments of the plurality of rows do not store the same data.

21. The CAM array of claim 17, wherein the interconnect circuit includes a plurality of multiplexers, wherein a respective multiplexer of the plurality of multiplexers comprises:
    a first input coupled to the first match line segment of the respective row;

a second input coupled to the first match line segment of another row;

an output coupled to the second match line segment of the respective row; and a control input to receive the value for the respective row.

22. The CAM array of claim 14, further comprising:

a processor, having an input to receive data entries for the CAM array, having first outputs coupled to the first circuits, and having second outputs coupled to the second circuits, configured to generate the values in response to a comparison between the data entries to be stored in the CAM array.

23. The CAM array of claim 22, wherein the processor is further configured to store the data entries in the array in an order so that groups of data entries having common prefixes are stored in corresponding groups of adjacent rows of the CAM array.

24. The CAM array of claim 22, wherein the processor comprises a parity check circuit.

25. A content addressable memory (CAM) device, comprising:

a CAM array having a plurality of rows, wherein each row includes a first segment having a number of first CAM cells coupled to a first match line segment and includes a second segment having a number of second CAM cells coupled to a second match line segment; and an interconnect circuit having first inputs coupled to the first match line segments, second inputs to receive a number of values indicating whether the first row segments of a group of rows store the same data, and outputs coupled to the second match line segments.

26. The CAM device of claim 25, wherein the interconnect circuit is configured to selectively transmit match results from the first segment of a designated row of a respective group to the second segments of each of the rows in the respective group in response to a corresponding one of the values.

27. The CAM device of claim 25, wherein a respective row of the plurality of rows comprises:

a circuit having an input to receive a corresponding one of the values and having an output coupled to the first match line segment of the respective row.

28. The CAM device of claim 27, wherein the circuit is configured to selectively pre-charge the first match line segment of the respective row in response to the corresponding one of the values.

29. The CAM device of claim 28, wherein the circuit is further configured to disable the first segment of the respective row in response to the corresponding one of the values indicating that data stored in the first segment of the respective row is the same as data stored in the first row segment of another row.

30. The CAM device of claim 25, further comprising:

a processor configured to order a plurality of data entries for the CAM array, wherein the data entries within a respective group share a common prefix.

31. The CAM device of claim 30, wherein the processor comprises a parity check circuit.

* * * * *